(12) United States Patent
Jang et al.

(10) Patent No.: US 7,872,341 B1
(45) Date of Patent: Jan. 18, 2011

(54) SEMICONDUCTOR DEVICE

(75) Inventors: Sang Jae Jang, Seoul (KR); Ki Wook Lee, Seoul (KR); Jae Dong Kim, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/396,772

(22) Filed: Mar. 3, 2009

(51) Int. Cl.
| | |
|---|---|
| H01L 23/48 | (2006.01) |
| H01L 23/52 | (2006.01) |
| H01L 23/053 | (2006.01) |
| H01L 23/12 | (2006.01) |
| H01L 29/40 | (2006.01) |

(52) U.S. Cl. .................. 257/686; 257/690; 257/734; 257/700

(58) Field of Classification Search .............. 257/686, 257/685, 681, 778, 693, 777, 734, 690, 697, 257/666
See application file for complete search history.

(56) References Cited

U.S. PATENT DOCUMENTS 7,212,422 B2 * 5/2007 Koide ..................... 365/51

2005/0285248 A1 * 12/2005 See et al. ............... 257/681

FOREIGN PATENT DOCUMENTS

JP 2005-209814 8/2005

* cited by examiner

Primary Examiner—Chuong A. Luu
(74) Attorney, Agent, or Firm—Gunnison, McKay & Hodgson, L.L.P.; Serge J. Hodgson

(57) ABSTRACT

A semiconductor package comprises a plurality of stacked semiconductor chips having the same structure. Therefore, the semiconductor chips can be produced using masks of the same design, resulting in a reduction in production cost and an improvement in productivity. Each of the semiconductor chips includes a plurality of through-silicon vias penetrating therethrough. The through-silicon vias of each semiconductor chip include at least one signal pad through which a common signal is delivered to the semiconductor chip and at least one chip enable pad connected to at least one chip enable pin to select the semiconductor chip. The chip enable pin may be connected to or disconnected from the chip enable pad through a conductive line to select the semiconductor chip. The conductive line is sawn to disconnect the chip enable pin from the chip enable pad before stacking of the semiconductor chip. Therefore, the semiconductor chips can be configured to have the same design, thus eliminating the need for troublesome production management and control of the semiconductor chips.

20 Claims, 6 Drawing Sheets

SEMICONDUCTOR DEVICE

BACKGROUND OF THE INVENTION

1. Field of the Invention

The present invention relates to a semiconductor package.

2. Description of the Related Art

An increasing demand for miniaturization of electrical/electronic products with high performance has motivated research and development on technologies for the manufacture of large-capacity semiconductor modules. For example, a semiconductor module with large capacity may be manufactured by an increase in the capacity (that is, high integration) of constituent memory chips. This high integration may be realized by integrating a larger number of cells in a defined space of the semiconductor chips.

High integration of memory chips needs highly advanced technologies, for example, a technology associated with precise and fine line widths, and requires much development time. Under these circumstances, a semiconductor die stacking technology has been proposed to provide large-capacity semiconductor modules. Another technology has been proposed for fabricating next-generation wafer-level packages in which a plurality of semiconductor dies are formed.

In the fabrication of a wafer-level semiconductor package, via holes are formed in semiconductor chips and a solder is filled in the via holes to form through-silicon vias (TSVs). The semiconductor chips are interconnected through the through-silicon vias. Alternatively, wire bonding may be used to interconnect the semiconductor chips.

According to wire bonding interconnection, semiconductor chips are configured to have different designs so that the positions of chip enable pads may be controlled. In this case, however, the semiconductor chips are produced by different processes, entailing considerable processing costs. Further, wire bonding is carried out after stacking of the semiconductor chips, rendering the processing procedure complicated. According to the stacking of semiconductor chips through through-silicon vias (TSVs), signal pads through which common signals of the semiconductor chips are applied and chip enable pads through which selection signals are applied have the same structure and arrangement and are connected in all semiconductor chips, making it impossible to substantially select the semiconductor chips.

BRIEF SUMMARY OF THE INVENTION

A semiconductor package comprises a plurality of stacked semiconductor chips having the same structure. Therefore, the semiconductor chips can be produced using masks of the same design, resulting in a reduction in production cost and an improvement in productivity. Each of the semiconductor chips includes a plurality of through-silicon vias penetrating therethrough. The through-silicon vias of each semiconductor chip include at least one signal pad through which a common signal is delivered to the semiconductor chip and at least one chip enable pad connected to at least one chip enable pin to select the semiconductor chip. The chip enable pin may be connected to or disconnected from the chip enable pad through a conductive line to select the semiconductor chip. The conductive line is sawn to disconnect the chip enable pin from the chip enable pad before stacking of the semiconductor chip. Therefore, the semiconductor chips can be configured to have the same design, thus eliminating the need for troublesome production management and control of the semiconductor chips.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1A:
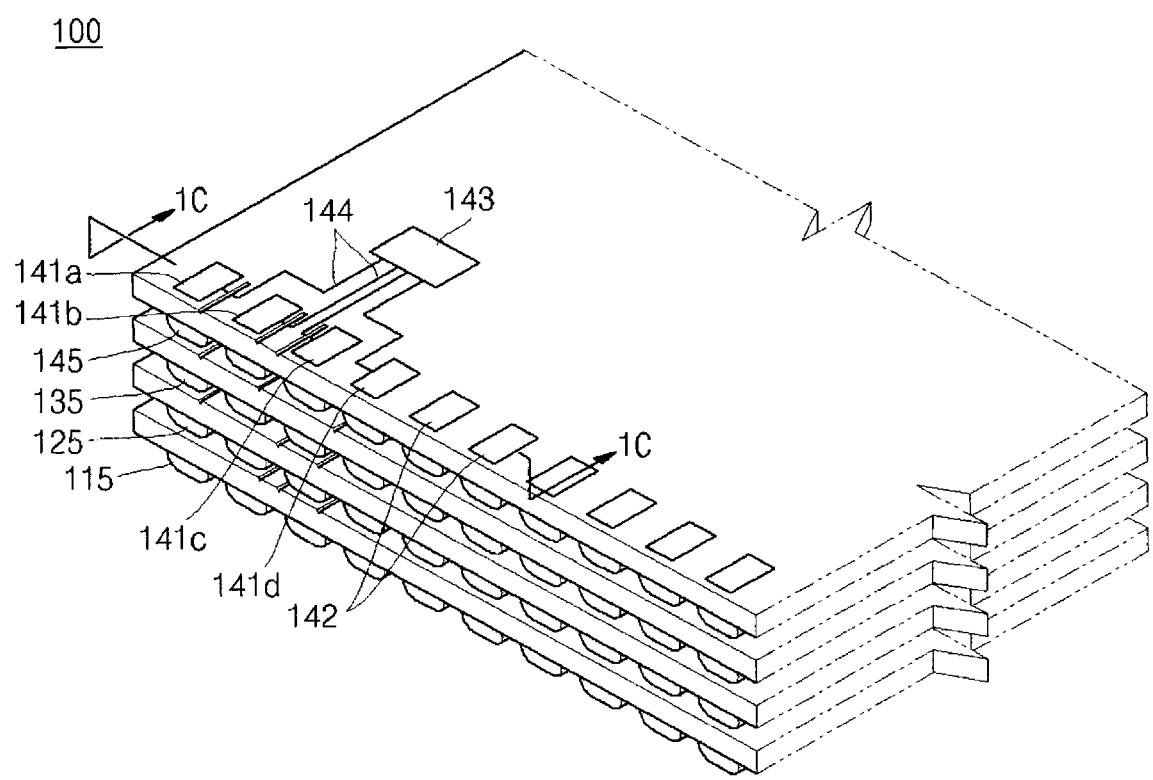
FIGS. 1A and 1B are a perspective view and an exploded perspective view illustrating a semiconductor package according to an embodiment of the present invention, respectively.
Figure 1B:
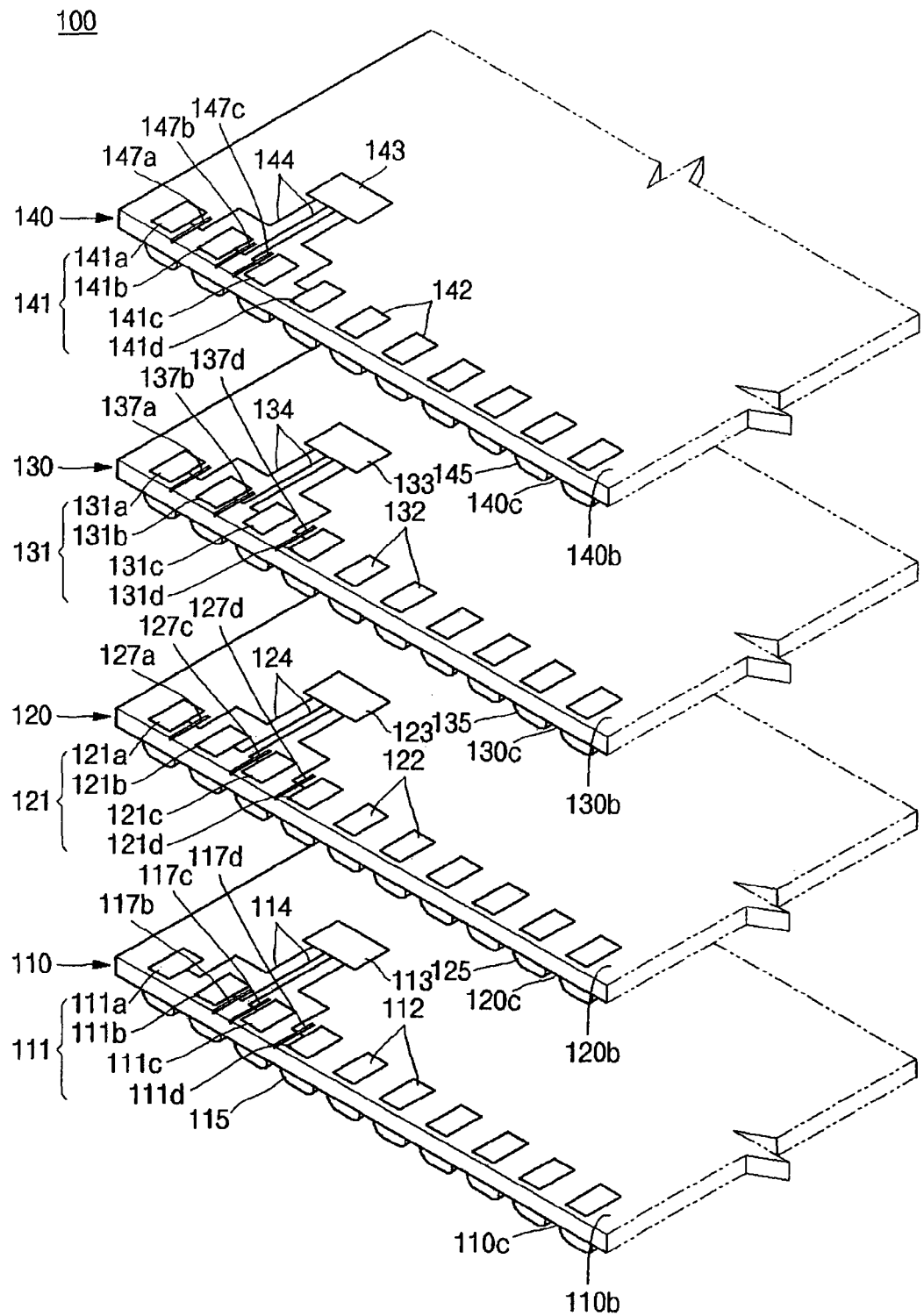
Figure 1C:
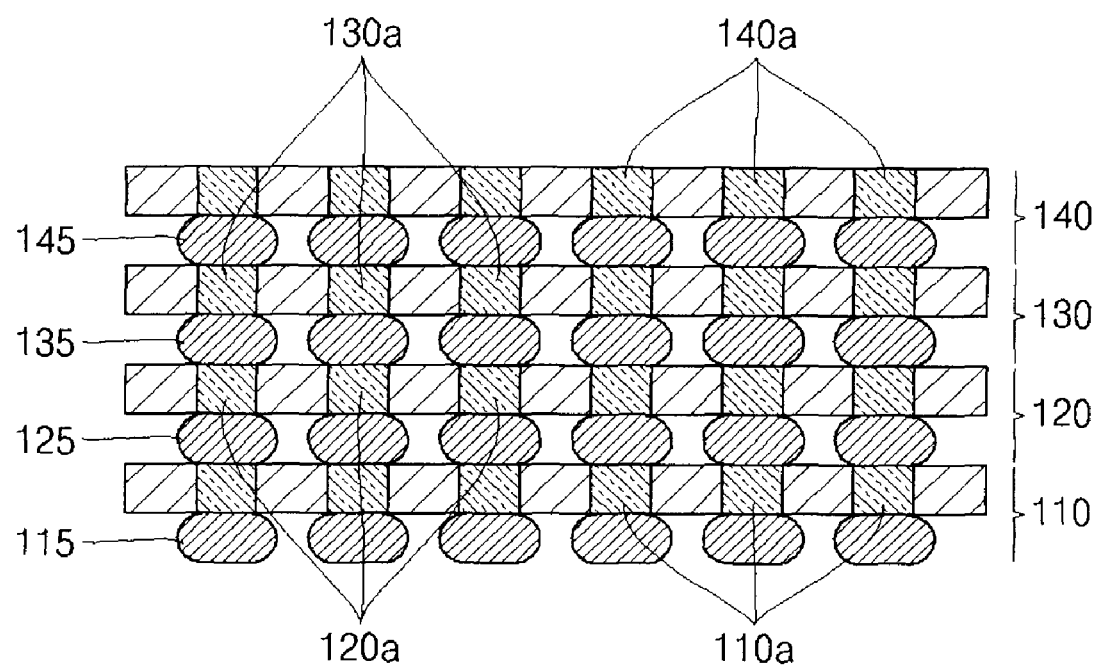
FIG. 1C is a cross-sectional view of the semiconductor package taken along line 1C-1C of FIG. 1A.

Referring to FIGS. 1A and 1B, there are illustrated a perspective view and an exploded perspective view of a semiconductor package 100 according to an embodiment of the present invention, respectively. Referring to FIG. 1C, there is illustrated a cross-sectional view of semiconductor package 100 taken along line 1C-1C of FIG. 1A.

As illustrated in FIGS. 1A, 1B and 1C, the semiconductor package 100 comprises a first semiconductor chip 110, a second semiconductor chip 120, a third semiconductor chip 130 and a fourth semiconductor chip 140. Through-silicon vias 110a, 120a, 130a and 140a are formed in the semiconductor chips 110, 120, 130 and 140, respectively. The through-silicon vias 110a, 120a, 130a and 140a have the same structure and are arranged in the same configuration. The through-silicon vias of each semiconductor chip include at least one chip enable pad and at least one signal pad.

The first semiconductor chip 110 includes chip enable pads 111 by which the first semiconductor chip 110 is selected, signal pads 112 through which common signals are delivered, a chip enable pin 113 by which the selection of the semiconductor chip 110 is determined in response to signals applied through the chip enable pads 111, conductive lines 114 through which the chip enable pads 111 are electrically connected to the chip enable pin 113, and first solder balls 115 electrically connected to the chip enable pads 111 and the signal pads 112 through the through-silicon vias 110a.

The chip enable pads 111 are formed so as to penetrate a first flat plane 110b, i.e., surface, of the first semiconductor chip 110 and a second flat plane 110c, i.e., surface, opposite to the first plane 110b. The chip enable pads 111 can be formed of a material selected from, but not limited to, metal materials, such as palladium (Pd), gold (Au), silver (Ag), tin (Sn), nickel (Ni), iron (Fe), copper (Cu) and platinum (Pt), and equivalents thereof. The chip enable pads 111 include a first chip enable pad 111a, a second chip enable pad 111b, a third chip enable pad 111c and a fourth chip enable pad 111d. The chip enable pads 111 may be electrically connected to or disconnected from the chip enable pin 113 through the four conductive lines 114, sometimes called the first, second, third, and fourth conductive lines 114.

The first chip enable pad 111a and the chip enable pin 113 are electrically connected to each other through the corresponding conductive line 114. The other conductive lines 114 connecting the second, third and fourth chip enable pads 111b, 111c and 111d to the chip enable pin 113 are sawn such that the second, third and fourth chip enable pads 111b, 111c and 111d are electrically disconnected from the chip enable pin 113.

That is, the first chip enable pad 111a is electrically connected to the chip enable pin 113 through the corresponding conductive line 114, and the second, third and fourth chip enable pads 111b, 111c and 111d are electrically disconnected, i.e., electrically isolated, from the chip enable pin 113 through cuts in the other conductive lines 114.

Due to this electrical connection/disconnection, the first semiconductor chip 110 receives a selection signal applied through the first chip enable pad 111a, and is then selected.

Common signals are delivered to the first, second, third and fourth semiconductor chips 110, 120, 130 and 140 through the signal pads 112. The common signals can be applied to the semiconductor chips 110, 120, 130 and 140 because the signal pads 112, 122, 132 and 142 of the first, second, third and fourth semiconductor chips 110, 120, 130 and 140 are electrically interconnected.

The signal pads 112 can be electrically connected to an external device through the first solder balls 115, and the second, third and fourth semiconductor chips 120, 130 and 140 can share common signals applied from the external device. That is, the stacking of the first, second, third and fourth semiconductor chips 110, 120, 130 and 140 allows the signal pads 112, 122, 132 and 142 to be electrically interconnected and to receive the common signals applied from the external device through the first solder balls 115.

The chip enable pin 113 may be electrically connected to or disconnected from the chip enable pads 111 through the conductive lines 114 and determines whether or not to select the first semiconductor chip 110 through the chip enable pads 111 through which selection signals are applied. The chip enable pin 113 is electrically connected to the first chip enable pad 111a through the corresponding conductive line 114, sometimes called a first conductive line 114, and is electrically disconnected from the second, third and fourth chip enable pads 111b, 111c and 111d through cuts in the other conductive lines 114. That is, the chip enable pin 113 is electrically connected to the first chip enable pad 111a and is electrically disconnected from the second, third and fourth chip enable pads 111b, 111c and 111d. The chip enable pin 113 can be formed on the first plane 110b of the first semiconductor chip 110.

The conductive lines 114 electrically connect or disconnect the chip enable pads 111 to or from the chip enable pin 113. The conductive lines 114 are formed on the first plane 110b of the first semiconductor chip 110. The first plane 110b can be sawn to electrically disconnect the chip enable pads 111 from the chip enable pin 113. Specifically, the conductive lines 114 connected to the second, third and fourth chip enable pads 111b, 111c and 111d are sawn to form cuts 117b, 117c, 117d in conductive lines 114 to electrically disconnect the second, third and fourth chip enable pads 111b, 111c and 111d from the chip enable pin 113. There is no restriction on the sawing method of the conductive lines 114. For example, a laser may be used to saw the conductive lines 114. A cut is sometimes called a groove, score, trench, or channel in first plane 110b.

The first solder balls 115 are welded and electrically connected to the chip enable pads 111 and the signal pads 112 on the second plane 110c. The semiconductor package 100 can be mounted on an external device through the first solder balls 115. The first solder balls 115 can be made of a material selected from tin/lead, lead-free tin and equivalents thereof, but are not limited to these materials.

The second semiconductor chip 120 includes chip enable pads 121 by which the second semiconductor chip 120 is selected, signal pads 122 through which the common signals are delivered, a chip enable pin 123 by which the selection of the semiconductor chip 120 is determined in response to the signals applied through the chip enable pads 121, conductive lines 124 through which the chip enable pads 121 are electrically connected to the chip enable pin 123, and second solder balls 125 electrically connected to the chip enable pads 121 and the signal pads 122 through the through-silicon vias 120a.

The second semiconductor chip 120 has the same constitution as the first semiconductor chip 110 except for the connection between the chip enable pin 123 and the chip enable pads 121 after sawing of the conductive lines 124 and the connection of the second solder balls 125. The differences between the first and second semiconductor chips 110 and 120 in terms of constitution and connection will be mainly explained below.

The chip enable pads 121 include a first chip enable pad 121a, a second chip enable pad 121b, a third chip enable pad 121c and a fourth chip enable pad 121d. The conductive lines 124 electrically connect or disconnect the chip enable pads 121 to or from the chip enable pin 123. Specifically, the chip enable pin 123 is electrically disconnected from the first, third and fourth chip enable pads 121a, 121c and 121d and is electrically connected to the second chip enable pad 121b through the conductive lines 124. The conductive lines 124 can be formed on a first plane 120b of the second semiconductor chip 120. The first plane 120b can be sawn to electrically disconnect the chip enable pads 121 from the chip enable pin 123. Specifically, the conductive lines 124 connected to the first, third and fourth chip enable pads 121a, 121c and 121d are sawn to form cuts 127a, 127c, 127d in conductive lines 124 to electrically disconnect the first, third and fourth chip enable pads 121a, 121c and 121d from the chip enable pin 123. There is no restriction on the sawing method of the conductive lines 124. For example, a laser may be used to saw the conductive lines 124.

The second solder balls 125 are welded and electrically connected to the chip enable pads 121 and the signal pads 122 on a second plane 120c of the second semiconductor chip 120. The second semiconductor chip 120 can be stacked on the first plane 110b of the first semiconductor chip 110 through the second solder balls 125. The stacking is achieved in such a manner that the second solder balls 125 of the second semiconductor chip 120 are brought into contact with the through-silicon vias 110a of the first semiconductor chip 110. After the stacking, the through-silicon vias 110a of the first semiconductor chip 110 are electrically connected to the through-silicon vias 120a of the second semiconductor chip 120 through the second solder balls 125.

Since the structure of the second semiconductor chip 120 is the same as that of the first semiconductor chip 110, the chip enable pads 121 and the signal pads 122 of the second semiconductor chip 120 are electrically connected to the chip enable pads 111 and the signal pads 112 of the first semiconductor chip 110, respectively. With this configuration, the signal pads 122 of the second semiconductor chip 120 formed at positions corresponding to the signal pads 112 of the first semiconductor chip 110 can receive the common signals from the signal pads 112 through the second solder balls 125, and the chip enable pads 121 of the second semiconductor chip 120 formed at positions corresponding to the chip enable pads 111 of the first semiconductor chip 110 can receive the selection signals from the chip enable pads 111 through the second solder balls 125. The semiconductor chips 110 and 120 can be individually selected in response to the selection signals because the chip enable pads 111a and 121b in different positions are electrically connected to the chip enable pins 113 and 123, respectively. The second solder balls 125 can be made of a material selected from tin/lead, lead-free tin and equivalents thereof, but are not limited to these materials.

The third semiconductor chip 130 includes chip enable pads 131 by which the third semiconductor chip 130 is selected, signal pads 132 through which the common signals are delivered, a chip enable pin 133 by which the selection of the semiconductor chip 130 is determined in response to the signals applied through the chip enable pads 131, conductive lines 134 through which the chip enable pads 131 are electrically connected to the chip enable pin 133, and third solder balls 135 electrically connected to the chip enable pads 131 and the signal pads 132 through the through-silicon vias 130a.

The third semiconductor chip 130 has the same constitution as the first and second semiconductor chips 110 and 120 except for the connection between the chip enable pin 133 and the chip enable pads 131 after sawing of the conductive lines 134 and the connection of the third solder balls 135. The differences of the third semiconductor chip 130 with respect to the first and second semiconductor chips 110 and 120 in terms of constitution and connection will be mainly explained below.

The chip enable pads 131 include a first chip enable pad 131a, a second chip enable pad 131b, a third chip enable pad 131c and a fourth chip enable pad 131d. The conductive lines 134 electrically connect or disconnect the chip enable pads 131 to or from the chip enable pin 133. Specifically, the chip enable pin 133 is electrically disconnected from the first, second and fourth chip enable pads 131a, 131b and 131d and is electrically connected to the third chip enable pad 131c through the conductive lines 134. The conductive lines 134 can be formed on a first plane 130b of the third semiconductor chip 130. The first plane 130b can be sawn to electrically disconnect the chip enable pads 131 from the chip enable pin 133. Specifically, the conductive lines 134 connected to the first, second and fourth chip enable pads 131a, 131b and 131d are sawn to form cuts 137a, 137b, 137d in conductive lines 134 to electrically disconnect the first, second and fourth chip enable pads 131a, 131b and 131d from the chip enable pin 133. There is no restriction on the sawing method of the conductive lines 134. For example, a laser may be used to saw the conductive lines 134.

The third solder balls 135 are welded and electrically connected to the chip enable pads 131 and the signal pads 132 on a second plane 130c of the third semiconductor chip 130. The third semiconductor chip 130 can be stacked on the first plane 120b of the second semiconductor chip 120 through the third solder balls 135. The stacking is achieved in such a manner that the third solder balls 135 of the third semiconductor chip 130 are brought into contact with the through-silicon vias 120a of the second semiconductor chip 120. After the stacking, the through-silicon vias 120a of the second semiconductor chip 120 are electrically connected to the through-silicon vias 130a of the third semiconductor chip 130 through the third solder balls 135.

Since the structure of the third semiconductor chip 130 is the same as that of the second semiconductor chip 120, the chip enable pads 131 and the signal pads 132 of the third semiconductor chip 130 are electrically connected to the chip enable pads 121 and the signal pads 122 of the second semiconductor chip 120, respectively. With this configuration, the signal pads 132 of the third semiconductor chip 130 formed at positions corresponding to the signal pads 122 of the second semiconductor chip 120 can receive the common signals from the signal pads 122 through the third solder balls 135, and the chip enable pads 131 of the third semiconductor chip 130 formed at positions corresponding to the chip enable pads 121 of the second semiconductor chip 120 can receive the selection signals from the chip enable pads 121 through the third solder balls 135. The semiconductor chips 110, 120 and 130 can be individually selected in response to the selection signals because the chip enable pads 111a, 121b and 131c in different positions are electrically connected to the chip enable pins 113, 123 and 133, respectively. The third solder balls 135 can be made of a material selected from tin/lead, lead-free tin and equivalents thereof, but are not limited to these materials.

The fourth semiconductor chip 140 includes chip enable pads 141 by which the fourth semiconductor chip 140 is selected, signal pads 142 through which the common signals are delivered, a chip enable pin 143 by which the selection of the semiconductor chip 140 is determined in response to the signals applied through the chip enable pads 141, conductive lines 144 through which the chip enable pads 141 are electrically connected to the chip enable pin 143, and fourth solder balls 145 electrically connected to the chip enable pads 141 and the signal pads 142 through the through-silicon vias 140a.

The fourth semiconductor chip 140 has the same constitution as the first, second and third semiconductor chips 110, 120 and 130 except for the connection between the chip enable pin 143 and the chip enable pads 141 after sawing of the conductive lines 144 and the connection of the fourth solder balls 145. The differences of the fourth semiconductor chip 140 with respect to the first, second and third semiconductor chips 110, 120 and 130 in terms of constitution and connection will be mainly explained below.

The chip enable pads 141 include a first chip enable pad 141a, a second chip enable pad 141b, a third chip enable pad 141c and a fourth chip enable pad 141d. The conductive lines 144 electrically connect or disconnect the chip enable pads 141 to or from the chip enable pin 143. Specifically, the chip enable pin 143 is electrically disconnected from the first, second and third chip enable pads 141a, 141b and 141c and is electrically connected to the fourth chip enable pad 141d through the conductive lines 144. The conductive lines 144 can be formed on a first plane 140b of the fourth semiconductor chip 140. The first plane 140b can be sawn to electrically disconnect the chip enable pads 141 from the chip enable pin 143. Specifically, the conductive lines 144 connected to the first, second and third chip enable pads 141a, 141b and 141c are sawn to form cuts 147a, 147b, 147c in conductive lines 144 to electrically disconnect the first, second and third chip enable pads 141a, 141b and 141c from the chip enable pin 143. There is no restriction on the sawing method of the conductive lines 144. For example, a laser may be used to saw the conductive lines 144.

The fourth solder balls 145 are welded and electrically connected to the chip enable pads 141 and the signal pads 142 on a second plane 140c of the fourth semiconductor chip 140. The fourth semiconductor chip 140 can be stacked on the first plane 130b of the third semiconductor chip 13C) through the fourth solder balls 145. The stacking is achieved in such a manner that the fourth solder balls 145 of the fourth semiconductor chip 140 are brought into contact with the through-silicon vias 130a of the third semiconductor chip 130. After the stacking, the through-silicon vias 130a of the third semiconductor chip 130 are electrically connected to the through-silicon vias 140a of the fourth semiconductor chip 140 through the fourth solder balls 145.

Since the structure of the fourth semiconductor chip 140 is the same as that of the third semiconductor chip 130, the chip enable pads 141 and the signal pads 142 of the fourth semiconductor chip 140 are electrically connected to the chip enable pads 131 and the signal pads 132 of the third semiconductor chip 130, respectively. With this configuration, the signal pads 142 of the fourth semiconductor chip 140 formed at positions corresponding to the signal pads 132 of the third semiconductor chip 130 can receive the common signals from the signal pads 132 through the fourth solder balls 145, and the chip enable pads 141 of the fourth semiconductor chip 140 formed at positions corresponding to the chip enable pads 131 of the third semiconductor chip 130 can receive the selection signals from the chip enable pads 131 through the fourth solder balls 145. The semiconductor chips 110, 120, 130 and 140 can be individually selected in response to the selection signals because the chip enable pads 111a, 121b, 131c and 141d in different positions are electrically connected to the chip enable pins 113, 123, 133 and 143, respectively. The fourth solder balls 145 can be made of a material selected from tin/lead, lead-free tin and equivalents thereof, but are not limited to these materials.

The first, second, third and fourth semiconductor chips 110, 120, 130 and 140 of the semiconductor package 100 are structurally identical and have the same pattern. Therefore, the semiconductor chips of the semiconductor package 100 can be produced using masks of the same design, resulting in a reduction in production cost and an improvement in productivity. In the semiconductor package 100, the conductive lines 114, 124, 134 and 144 can be sawn to select the first, second, third and fourth semiconductor chips 110, 120, 130 and 140. The semiconductor chips of the semiconductor package 100 can be configured to have the same design, thus eliminating the need for troublesome production management and control of the semiconductor chips. In addition, the semiconductor chips of the semiconductor package 100 can be produced by the same process without the need to separate the semiconductor chips prior to the sawing of the conductive lines 114, 124, 134 and 144.

Figure 2:
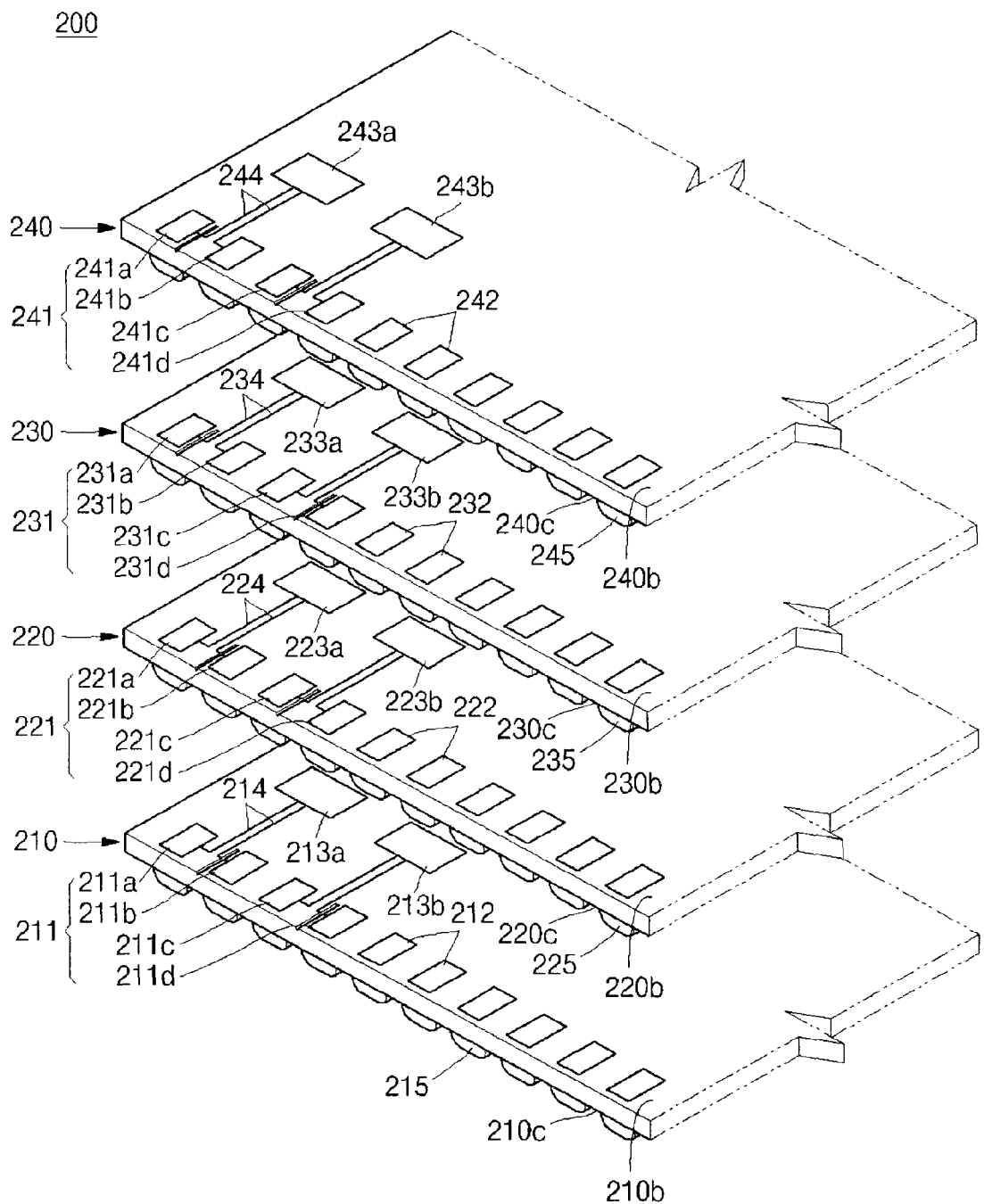
FIG. 2 is an exploded perspective view illustrating a semiconductor package according to a further embodiment of the present invention.

Referring to FIG. 2, there is illustrated an exploded perspective view of a semiconductor package 200 according to a further embodiment of the present invention.

As illustrated in FIG. 2, the semiconductor package 200 comprises a first semiconductor chip 210, a second semiconductor chip 220, a third semiconductor chip 230 and a fourth semiconductor chip 240. Through-silicon vias are formed in the semiconductor chips 210, 220, 230 and 240. The through-silicon vias of the semiconductor chips 210, 220, 230 and 240 have the same structure and are arranged in the same configuration. The through-silicon vias of each semiconductor chip include at least one chip enable pad and at least one signal pad.

The first semiconductor chip 210 includes chip enable pads 211 by which the first semiconductor chip 210 is selected, signal pads 212 through which common signals are delivered, chip enable pins 213a and 213b by which the selection of the semiconductor chip 210 is determined in response to signals applied through the chip enable pads 211, conductive lines 214 through which the chip enable pads 211 are electrically connected to the chip enable pins 213a and 213b, and first solder balls 215 electrically connected to the chip enable pads 211 and the signal pads 212 through the through-silicon vias of the first semiconductor chip 210.

The chip enable pads 211 are formed so as to penetrate a first flat plane 210b of the first semiconductor chip 210 and a second flat plane 210c opposite to the first plane 210b. The chip enable pads 211 can be formed of a material selected from, but not limited to, metal materials, such as palladium (Pd), gold (Au), silver (Ag), tin (Sn), nickel (Ni), iron (Fe), copper (Cu) and platinum (Pt), and equivalents thereof. The chip enable pads 211 include a first chip enable pad 211a, a second chip enable pad 211b, a third chip enable pad 211c and a fourth chip enable pad 211d. The chip enable pins 213a and 213b include a first chip enable pin 213a and a second chip enable pin 213b. The first and second chip enable pads 211a and 211b may be electrically connected to or disconnected from the first chip enable pin 213a through the conductive lines 214, and the third and fourth chip enable pads 211c and 211d may be electrically connected to or disconnected from the second chip enable pin 213b through the conductive lines 214.

The first and third chip enable pads 211a and 211c are electrically connected to the chip enable pins 213a and 213b through the conductive lines 214, respectively. The conductive lines 214 connecting the second and fourth chip enable pads 211b and 211d to the first and second chip enable pins 213a and 213b, respectively, are sawn such that the second and fourth chip enable pads 211b and 211d are electrically disconnected from the first and second chip enable pins 213a and 213b, respectively.

That is, the first and third chip enable pads 211a and 211c are electrically connected to the first and second chip enable pins 213a and 213b through the conductive lines 214, respectively, and the second and fourth chip enable pads 211b and 211d are electrically disconnected from the first and second chip enable pins 213a and 213b through cuts in the other conductive lines 214, respectively.

Due to this electrical connection/disconnection, the first semiconductor chip 210 receives selection signals applied through the first and third chip enable pads 211a and 211c, and is then selected.

Common signals are delivered to the first, second, third and fourth semiconductor chips 210, 220, 230 and 240 through the signal pads 212. The common signals can be applied to the semiconductor chips 210, 220, 230 and 240 because the signal pads 212, 222, 232 and 242 of the first, second, third and fourth semiconductor chips 210, 220, 230 and 240 are electrically interconnected.

The signal pads 212 can be electrically connected to an external device through the first solder balls 215, and the second, third and fourth semiconductor chips 220, 230 and 240 can share common signals applied from the external device. That is, the stacking of the first, second, third and fourth semiconductor chips 210, 220, 230 and 240 allows the signal pads 212, 222, 232 and 242 to be electrically interconnected and to receive the common signals applied from the external device through the first solder balls 215.

The chip enable pins 213a and 213b may be electrically connected to or disconnected from the chip enable pads 211 through the conductive lines 214 and determines whether or not to select the first semiconductor chip 210 through the chip enable pads 211 through which selection signals are applied. The chip enable pin 213a is electrically connected to the first chip enable pad 211a through the corresponding conductive line 214 and is electrically disconnected from the second chip enable pad 211b through a cut in the corresponding conductive line 214. The chip enable pin 213b is electrically connected to the third chip enable pad 211c through the corresponding conductive line 214 and is electrically disconnected from the fourth chip enable pad 211d through a cut in the corresponding conductive line 214. The chip enable pins 213a and 213b can be formed on the first plane 210b of the first semiconductor chip 210.

The conductive lines 214 electrically connect or disconnect the chip enable pads 211 to or from the chip enable pins 213a and 213b. The conductive lines 214 are formed on the first plane 210b of the first semiconductor chip 210. The first plane 210b can be sawn to electrically disconnect the chip enable pads 211 from the chip enable pins 213a and 213b. Specifically, the conductive lines 214 connected to the second and fourth chip enable pads 211b and 211d are sawn to form cuts in conductive lines 214 to electrically disconnect the second and fourth chip enable pads 211b and 211d from the chip enable pins 213a and 213b, respectively. There is no restriction on the sawing method of the conductive lines 214. For example, a laser may be used to saw the conductive lines 214.

The first solder balls 215 are welded and electrically connected to the chip enable pads 211 and the signal pads 212 on the second plane 210c. The semiconductor package 200 can be mounted on an external device through the first solder balls 215. The first solder balls 215 can be made of a material selected from tin/lead, lead-free tin and equivalents thereof, but are not limited to these materials.

The second semiconductor chip 220 includes chip enable pads 221 by which the second semiconductor chip 220 is selected, signal pads 222 through which the common signals are delivered, chip enable pins 223a and 223b by which the selection of the semiconductor chip 220 is determined in response to the signals applied through the chip enable pads 221, conductive lines 224 through which the chip enable pads 221 are electrically connected to the chip enable pins 223a and 223b, and second solder balls 225 electrically connected to the chip enable pads 221 and the signal pads 222 through the through-silicon vias of the second semiconductor chip 220.

The second semiconductor chip 220 has the same constitution as the first semiconductor chip 210 except for the connection between the chip enable pins 223a and 223b and the chip enable pads 221 after sawing of the conductive lines 224 and the connection of the second solder balls 225. The differences between the first and second semiconductor chips 210 and 220 in terms of constitution and connection will be mainly explained below.

The chip enable pads 221 include a first chip enable pad 221a, a second chip enable pad 221b, a third chip enable pad 221c and a fourth chip enable pad 221d. The conductive lines 224 electrically connect or disconnect the chip enable pads 221 to or from the chip enable pins 223a and 223b. Specifically, the conductive lines 224 electrically connect the first chip enable pad 221a to the first chip enable pin 223a and the fourth chip enable pad 221d to the second chip enable pin 223b, and electrically disconnect the second chip enable pad 221b from the first chip enable pin 223a and the third chip enable pad 221c from the second chip enable pin 223b.

The conductive lines 224 can be formed on a first plane 220b of the second semiconductor chip 220. The first plane 210b can be sawn to electrically disconnect the chip enable pads 221 from the chip enable pins 223a and 223b. Specifically, the conductive lines 224 connected to the second and third chip enable pads 221b and 221c are sawn to form cuts in conductive lines 224 to electrically disconnect the second and third chip enable pads 221b and 221c from the chip enable pins 223a and 223b, respectively. There is no restriction on the sawing method of the conductive lines 224. For example, a laser may be used to saw the conductive lines 224.

The second solder balls 225 are welded and electrically connected to the chip enable pads 221 and the signal pads 222 on a second plane 220c of the second semiconductor chip 220. The second semiconductor chip 220 can be stacked on the first plane 210b of the first semiconductor chip 210 through the second solder balls 225. The stacking is achieved in such a manner that the second solder balls 225 of the second semiconductor chip 220 are brought into contact with the through-silicon vias of the first semiconductor chip 210. After the stacking, the through-silicon vias of the first semiconductor chip 210 are electrically connected to the through-silicon vias of the second semiconductor chip 220 through the second solder balls 225.

Since the structure of the second semiconductor chip 220 is the same as that of the first semiconductor chip 210, the chip enable pads 221 and the signal pads 222 of the second semiconductor chip 220 are electrically connected to the chip enable pads 211 and the signal pads 212 of the first semiconductor chip 210, respectively. With this configuration, the signal pads 222 of the second semiconductor chip 220 formed at positions corresponding to the signal pads 212 of the first semiconductor chip 210 can receive the common signals from the signal pads 212 through the second solder balls 225, and the chip enable pads 221 of the second semiconductor chip 220 formed at positions corresponding to the chip enable pads 211 of the first semiconductor chip 210 can receive the selection signals from the chip enable pads 211 through the second solder balls 225. The semiconductor chips 210 and 220 can be individually selected in response to the selection signals because the chip enable pads 211a, 211c, 221a and 221d in different positions are electrically connected to the chip enable pins 213a, 213b, 223a and 223b, respectively. The second solder balls 225 can be made of a material selected from tin/lead, lead-free tin and equivalents thereof, but are not limited to these materials.

The third semiconductor chip 230 includes chip enable pads 231 by which the third semiconductor chip 230 is selected, signal pads 232 through which the common signals are delivered, chip enable pins 233a and 233b by which the selection of the semiconductor chip 230 is determined in response to the signals applied through the chip enable pads 231, conductive lines 234 through which the chip enable pads 231 are electrically connected to the chip enable pins 233a and 233b, and third solder balls 235 electrically connected to the chip enable pads 231 and the signal pads 232 through the through-silicon vias of the third semiconductor chip 230.

The third semiconductor chip 230 has the same constitution as the first and second semiconductor chips 210 and 220 except for the connection between the chip enable pins 233a and 233b and the chip enable pads 231 after sawing of the conductive lines 234 and the connection of the third solder balls 235. The differences of the third semiconductor chip 230 with respect to the first and second semiconductor chips 210 and 220 in terms of constitution and connection will be mainly explained below.

The chip enable pads 231 include a first chip enable pad 231a, a second chip enable pad 231b, a third chip enable pad 231c and a fourth chip enable pad 231d. The conductive lines 234 electrically connect or disconnect the chip enable pads 231 to or from the chip enable pins 233a and 233b. Specifically, the conductive lines 234 electrically connect the second chip enable pad 231b to the first chip enable pin 233a and the third chip enable pad 231c to the second chip enable pin 233b, and electrically disconnect the first chip enable pad 231a from the first chip enable pin 233a and the fourth chip enable pad 231d from the second chip enable pin 233b.

The conductive lines 234 can be formed on a first plane 230b of the third semiconductor chip 230. The first plane 230b can be sawn to electrically disconnect the chip enable pads 231 from the chip enable pins 233a and 233b. Specifically, the conductive lines 234 connected to the first and fourth chip enable pads 231a and 231d are sawn to form cuts in the conductive lines 234 to electrically disconnect the first and fourth chip enable pads 231a and 231d from the chip enable pins 233a and 233b, respectively. There is no restriction on the sawing method of the conductive lines 234. For example, a laser may be used to saw the conductive lines 234.

The third solder balls 235 are welded and electrically connected to the chip enable pads 231 and the signal pads 232 on a second plane 230c of the third semiconductor chip 230. The third semiconductor chip 230 can be stacked on the first plane 220b of the second semiconductor chip 220 through the third solder balls 235. The stacking is achieved in such a manner that the third solder balls 235 of the third semiconductor chip 230 are brought into contact with the through-silicon vias of the second semiconductor chip 220. After the stacking, the through-silicon vias of the second semiconductor chip 220 are electrically connected to the through-silicon vias of the third semiconductor chip 230 through the third solder balls 235.

Since the structure of the third semiconductor chip 230 is the same as that of the second semiconductor chip 220, the chip enable pads 231 and the signal pads 232 of the third semiconductor chip 230 are electrically connected to the chip enable pads 221 and the signal pads 222 of the second semiconductor chip 220, respectively. With this configuration, the signal pads 232 of the third semiconductor chip 230 formed at positions corresponding to the signal pads 222 of the second semiconductor chip 220 can receive the common signals from the signal pads 222 through the third solder balls 235, and the chip enable pads 231 of the third semiconductor chip 230 formed at positions corresponding to the chip enable pads 221 of the second semiconductor chip 220 can receive the selection signals from the chip enable pads 221 through the third solder balls 235. The semiconductor chips 210, 220 and 230 can be individually selected in response to the selection signals because the chip enable pads 211a, 211c, 221a, 221d, 231b and 231c in different positions are electrically connected to the chip enable pins 213a, 213b, 223a, 223b, 233a and 233b, respectively. The third solder balls 235 can be made of a material selected from tin/lead, lead-free tin and equivalents thereof, but are not limited to these materials.

The fourth semiconductor chip 240 includes chip enable pads 241 by which the fourth semiconductor chip 240 is selected, signal pads 242 through which the common signals are delivered, chip enable pins 243a and 243b by which the selection of the semiconductor chip 240 is determined in response to the signals applied through the chip enable pads 241, conductive lines 244 through which the chip enable pads 241 are electrically connected to the chip enable pins 243a and 243b, and fourth solder balls 245 electrically connected to the chip enable pads 241 and the signal pads 242 through the through-silicon vias of the fourth semiconductor chip 240.

The fourth semiconductor chip 240 has the same constitution as the first, second and third semiconductor chips 210, 220 and 230 except for the connection between the chip enable pins 243a and 243b and the chip enable pads 241 after sawing of the conductive lines 244 and the connection of the fourth solder balls 245. The differences of the fourth semiconductor chip 240 with respect to the first, second and third semiconductor chips 210, 220 and 230 in terms of constitution and connection will be mainly explained below.

The chip enable pads 241 include a first chip enable pad 241a, a second chip enable pad 241b, a third chip enable pad 241c and a fourth chip enable pad 241d. The conductive lines 244 electrically connect or disconnect the chip enable pads 241 to or from the chip enable pins 243a and 243b. Specifically, the conductive lines 244 electrically connect the second chip enable pad 241b to the first chip enable pin 243a and the fourth chip enable pad 241d to the second chip enable pin 243b, and electrically disconnect the first chip enable pad 241a from the first chip enable pin 243a and the third chip enable pad 241c from the second chip enable pin 243b.

The conductive lines 244 are on a first plane 240b of the fourth semiconductor chip 240. The first plane 240b can be sawn to electrically disconnect the chip enable pads 241 from the chip enable pins 243a and 243b. Specifically, the conductive lines 244 connected to the first and third chip enable pads 241a and 241c are sawn to form cuts in the conductive lines 244 to electrically disconnect the first and third chip enable pads 241a and 241c from the chip enable pins 243a and 243b, respectively. There is no restriction on the sawing method of the conductive lines 244. For example, a laser may be used to saw the conductive lines 244.

The fourth solder balls 245 are welded and electrically connected to the chip enable pads 241 and the signal pads 242 on a second plane 240c of the fourth semiconductor chip 24C). The fourth semiconductor chip 240 can be stacked on the first plane 230b of the third semiconductor chip 23C) through the fourth solder balls 245. The stacking is achieved in such a manner that the fourth solder balls 245 of the fourth semiconductor chip 240 are brought into contact with the through-silicon vias of the third semiconductor chip 230. After the stacking, the through-silicon vias of the third semiconductor chip 230 are electrically connected to the through-silicon vias of the fourth semiconductor chip 240 through the fourth solder balls 245.

Since the structure of the fourth semiconductor chip 240 is the same as that of the third semiconductor chip 230, the chip enable pads 241 and the signal pads 242 of the fourth semiconductor chip 240 are electrically connected to the chip enable pads 231 and the signal pads 232 of the third semiconductor chip 230, respectively. With this configuration, the signal pads 242 of the fourth semiconductor chip 240 formed at positions corresponding to the signal pads 232 of the third semiconductor chip 230 can receive the common signals from the signal pads 232 through the fourth solder balls 245, and the chip enable pads 241 of the fourth semiconductor chip 240 formed at positions corresponding to the chip enable pads 231 of the third semiconductor chip 230 can receive the selection signals from the chip enable pads 231 through the fourth solder balls 245. The semiconductor chips 210, 220, 230 and 240 can be individually selected in response to the selection signals because the chip enable pads in different positions are electrically connected to the chip enable pins, respectively. The fourth solder balls 245 can be made of a material selected from tin/lead, lead-free tin and equivalents thereof, but are not limited to these materials.

The first, second, third and fourth semiconductor chips 210, 220, 230 and 240 of the semiconductor package 200 are structurally identical and have the same pattern. Therefore, the semiconductor chips of the semiconductor package 200 can be produced using masks of the same design, resulting in a reduction in production cost and an improvement in productivity. In the semiconductor package 200, the conductive lines 214, 224, 234 and 244 can be sawn to select the first, second, third and fourth semiconductor chips 210, 220, 230 and 240. The semiconductor chips of the semiconductor package 200 can be configured to have the same design, thus eliminating the need for troublesome production management and control of the semiconductor chips. In addition, the semiconductor chips 210, 220, 230 and 240 can be produced by the same process without the need to separate the semiconductor chips prior to the sawing of the conductive lines 214, 224, 234 and 244.

Figure 3:
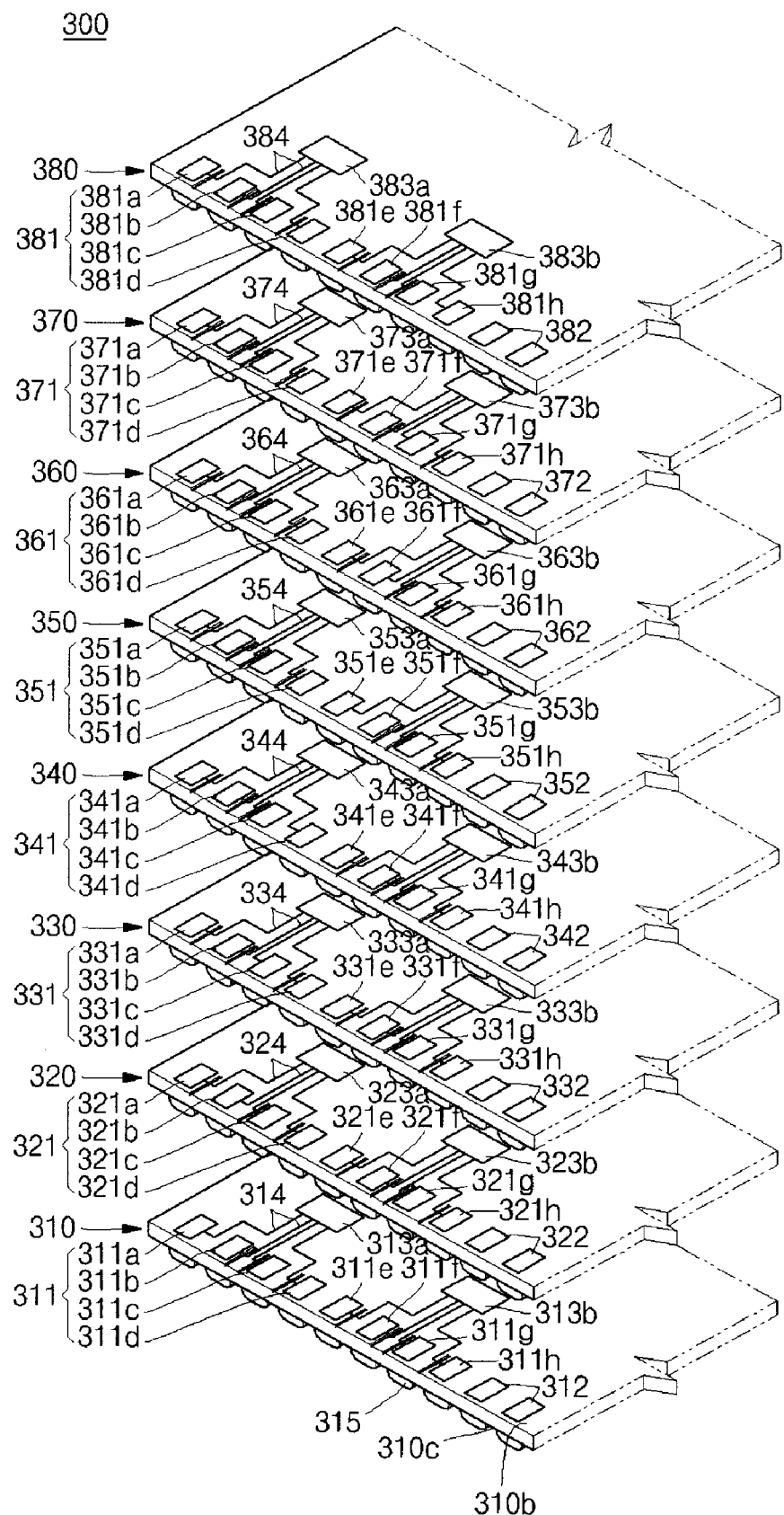
FIG. 3 is an exploded perspective view illustrating a semiconductor package according to another embodiment of the present invention.

Referring to FIG. 3, there is illustrated an exploded perspective view of a semiconductor package 300 according to another embodiment of the present invention.

As illustrated in FIG. 3, the semiconductor package 300 comprises a first semiconductor chip 310, a second semiconductor chip 320, a third semiconductor chip 330, a fourth semiconductor chip 340, a fifth semiconductor chip 350, a sixth semiconductor chip 360, a seventh semiconductor chip 370 and an eighth semiconductor chip 380. Through-silicon vias are formed in the semiconductor chips 310, 320, 330, 340, 350, 360, 370 and 380. The through-silicon vias of the semiconductor chips 310, 320, 330, 340, 350, 360, 370 and 380 have the same structure and are arranged in the same configuration. The through-silicon vias of each semiconductor chip include at least one chip enable pad and at least one signal pad.

The semiconductor package 300 is a stack of the eight semiconductor chips and is structurally similar to the semiconductor package 100 illustrated in FIGS. 1A, 1B and 1C. As the number of the stacked semiconductor chips in the semiconductor package 300 increases to eight, the number of chip enable pads through which selection signals are applied and chip enable pins is doubled compared to the semiconductor package 100. The chip enable pads and the chip enable pins, which are elements distinguishing the semiconductor package 300 from the semiconductor package 100, and conductive lines connecting the chip enable pads to the chip enable pins will be mainly explained below.

The first semiconductor chip 310 includes chip enable pads 311 by which the first semiconductor chip 310 is selected, signal pads 312 through which common signals are delivered, chip enable pins 313a and 313b by which the selection of the semiconductor chip 310 is determined in response to signals applied through the chip enable pads 311, conductive lines 314 through which the chip enable pads 311 are electrically connected to the chip enable pins 313a and 313b, and first solder balls 315 electrically connected to the chip enable pads 311 and the signal pads 312 through the through-silicon vias of the first semiconductor chip 310.

The chip enable pads 311 are formed so as to penetrate a first flat plane 310b of the first semiconductor chip 310 and a second flat plane 310c opposite to the first plane 310b. The chip enable pads 311 include a first chip enable pad 311a, a second chip enable pad 311b, a third chip enable pad 311c, a fourth chip enable pad 311d, a fifth chip enable pad 311e, a sixth chip enable pad 311f, a seventh chip enable pad 311g and an eighth chip enable pad 311h. The chip enable pins 313a and 313b include a first chip enable pin 313a and a second chip enable pin 313b. The chip enable pads 311 may be electrically connected to or disconnected from the chip enable pins 313a and 313b through the conductive lines 314.

The first chip enable pad 311a and the chip enable pin 313a are electrically connected to each other through the corresponding conductive line 314. The other conductive lines 314 connecting the second, third, fourth, fifth, sixth, seventh and eighth chip enable pads 311b, 311c, 311d, 311e, 311f, 311g and 311h to the chip enable pins 313a and 313b are sawn such that the second, third, fourth, fifth, sixth, seventh and eighth chip enable pads 311b, 311c, 311d, 311e, 311f, 311g and 311h are electrically disconnected from the chip enable pins 313a and 313b.

That is, the first chip enable pad 311a is electrically connected to the chip enable pin 313a through the corresponding conductive line 314, and the second, third, fourth, fifth, sixth, seventh and eighth chip enable pads 311b, 311c, 311d, 311e, 311f, 311g and 311h are electrically disconnected from the chip enable pins 313a and 313b through cuts in the other conductive lines 314.

Due to this electrical connection/disconnection, the first semiconductor chip 310 receives the selection signal applied through the first chip enable pad 311a, and is then selected.

The chip enable pins 313a and 313b may be electrically connected to or disconnected from the chip enable pads 311 through the conductive lines 314 and determines whether or not to select the first semiconductor chip 310 through the chip enable pads 311 through which selection signals are applied. The chip enable pin 313a is electrically connected to the first chip enable pad 311a through the corresponding conductive line 314 and is electrically disconnected from the second, third and fourth chip enable pads 311b, 311c and 311d through cuts in the other conductive lines 314. The chip enable pin 313b is electrically disconnected from the fifth, sixth, seventh and eighth chip enable pads 311e, 311f, 311g and 311h through cuts in the conductive lines 314. The chip enable pins 313a and 313b can be formed on the first plane 310b of the first semiconductor chip 310.

The conductive lines 314 electrically connect or disconnect the chip enable pads 311 to or from the chip enable pins 313a and 313b. The conductive lines 314 are formed on the first plane 110b of the first semiconductor chip 310. The first plane 310b can be sawn to electrically disconnect the chip enable pads 311 from the chip enable pins 313a and 313b. Specifically, the conductive lines 314 connected to the second, third, fourth, fifth, sixth, seventh and eighth chip enable pads 311b, 311c, 311d, 311e, 311f, 311g and 311h are sawn to form cuts in the conductive lines 314 to electrically disconnect the second, third, fourth, fifth, sixth, seventh and eighth chip enable pads 311b, 311c, 311d, 311e, 311f, 311g and 311h from the chip enable pins 313a and 313b. There is no restriction on the sawing method of the conductive lines 314. For example, a laser may be used to saw the conductive lines 314.

The second to eighth semiconductor chips 320, 330, 340, 350, 360, 370 and 380 are distinguished from the first semiconductor chip 310 by electrical connections between their constituent chip enable pads and chip enable pins. In other words, the second to eighth semiconductor chips 320, 330, 340, 350, 360, 370 and 380 have the same structure as the first semiconductor chip 310 except for the connection between the chip enable pads and chip enable pins after sawing of their constituent conductive lines.

In the second semiconductor chip 320, a second chip enable pad 321b is electrically connected to a first chip enable pin 323a through a corresponding conductive line 324. First, third and fourth chip enable pads 321a, 321c and 321d are electrically disconnected from the first chip enable pin 323a through cuts in the respective conductive lines 324, and fifth, sixth, seventh and eighth chip enable pads 321e, 321f, 321g and 321h are electrically disconnected from a second chip enable pin 323b through cuts in the respective conductive lines 324. Due to this electrical connection/disconnection, the second semiconductor chip 320 receives the selection signal applied through the second chip enable pad 321b, and is then selected.

In the third semiconductor chip 330, a third chip enable pad 331c is electrically connected to a first chip enable pin 333a through a corresponding conductive line 334. First, second and fourth chip enable pads 331a, 331b and 331d are electrically disconnected from the first chip enable pin 333a through cuts in the respective conductive lines 334, and fifth, sixth, seventh and eighth chip enable pads 331e, 331f, 331g and 331h are electrically disconnected from a second chip enable pin 333b through cuts in the respective conductive lines 334. Due to this electrical connection/disconnection, the third semiconductor chip 330 receives the selection signal applied through the third chip enable pad 331c, and is then selected.

In the fourth semiconductor chip 340, a fourth chip enable pad 341d is electrically connected to a first chip enable pin 343a through a corresponding conductive line 344. First, third and fourth chip enable pads 341a, 341c and 341d are electrically disconnected from the first chip enable pin 343a through cuts in the respective conductive lines 344, and fifth, sixth, seventh and eighth chip enable pads 341e, 341f, 341g and 341h are electrically disconnected from a second chip enable pin 343b through cuts in the respective conductive lines 344. Due to this electrical connection/disconnection, the fourth semiconductor chip 340 receives the selection signal applied through the fourth chip enable pad 341d, and is then selected.

In the fifth semiconductor chip 350, a fifth chip enable pad 351e is electrically connected to a second chip enable pin 353b through a corresponding conductive line 354. First, second, third and fourth chip enable pads 351a, 351b, 351c and 351d are electrically disconnected from a first chip enable pin 353a through cuts in the respective conductive lines 354, and sixth, seventh and eighth chip enable pads 351f, 351g and 351h are electrically disconnected from the second chip enable pin 353b through cuts in the respective conductive lines 354. Due to this electrical connection/disconnection, the fifth semiconductor chip 350 receives the selection signal applied through the fifth chip enable pad 351e, and is then selected.

In the sixth semiconductor chip 360, a sixth chip enable pad 361f is electrically connected to a second chip enable pin 363b through a corresponding conductive line 364. First, second, third and fourth chip enable pads 361a, 361b, 361c and 361d are electrically disconnected from a first chip enable pin 363a through cuts in the respective conductive lines 364, and fifth, seventh and eighth chip enable pads 361e, 361g and 361h are electrically disconnected from the second chip enable pin 363b through cuts in the respective conductive lines 364. Due to this electrical connection/disconnection, the sixth semiconductor chip 360 receives the selection signal applied through the sixth chip enable pad 361f, and is then selected.

In the seventh semiconductor chip 370, a seventh chip enable pad 371g is electrically connected to a second chip enable pin 373b through a corresponding conductive line 374. First, second, third and fourth chip enable pads 371a, 371b, 371c and 371d are electrically disconnected from a first chip enable pin 373a through cuts in the respective conductive lines 374, and fifth, sixth and eighth chip enable pads 371e, 371f and 371h are electrically disconnected from the second chip enable pin 373b through cuts in the respective conductive lines 374. Due to this electrical connection/disconnection, the seventh semiconductor chip 370 receives the selection signal applied through the seventh chip enable pad 371g, and is then selected.

In the eighth semiconductor chip 380, an eighth chip enable pad 381h is electrically connected to a second chip enable pin 383b through a corresponding conductive line 384. First, second, third and fourth chip enable pads 381a, 381b, 381c and 381d are electrically disconnected from a first chip enable pin 383a through cuts in the respective conductive lines 384, and fifth, sixth and seventh chip enable pads 381e, 381f and 381g are electrically disconnected from the second chip enable pin 383b through cuts in the respective conductive lines 384. Due to this electrical connection/disconnection, the eighth semiconductor chip 380 receives the selection signal applied through the eighth chip enable pad 381h, and is then selected.

The first to eighth semiconductor chips 310, 320, 330, 340, 350, 360, 370 and 380 of the semiconductor package 300 are structurally identical and have the same pattern. Therefore, the semiconductor chips of the semiconductor package 300 can be produced using masks of the same design, resulting in a reduction in production cost and an improvement in productivity. In the semiconductor package 300, the conductive lines can be sawn to select the first to eight semiconductor chips 310, 320, 330, 340, 350, 360, 370 and 380. The semiconductor chips of the semiconductor package 300 can be configured to have the same design, thus eliminating the need for troublesome production management and control of the semiconductor chips. In addition, the semiconductor chips can be produced by the same process without the need to separate the semiconductor chips prior to the sawing of the conductive lines.

Figure 4:
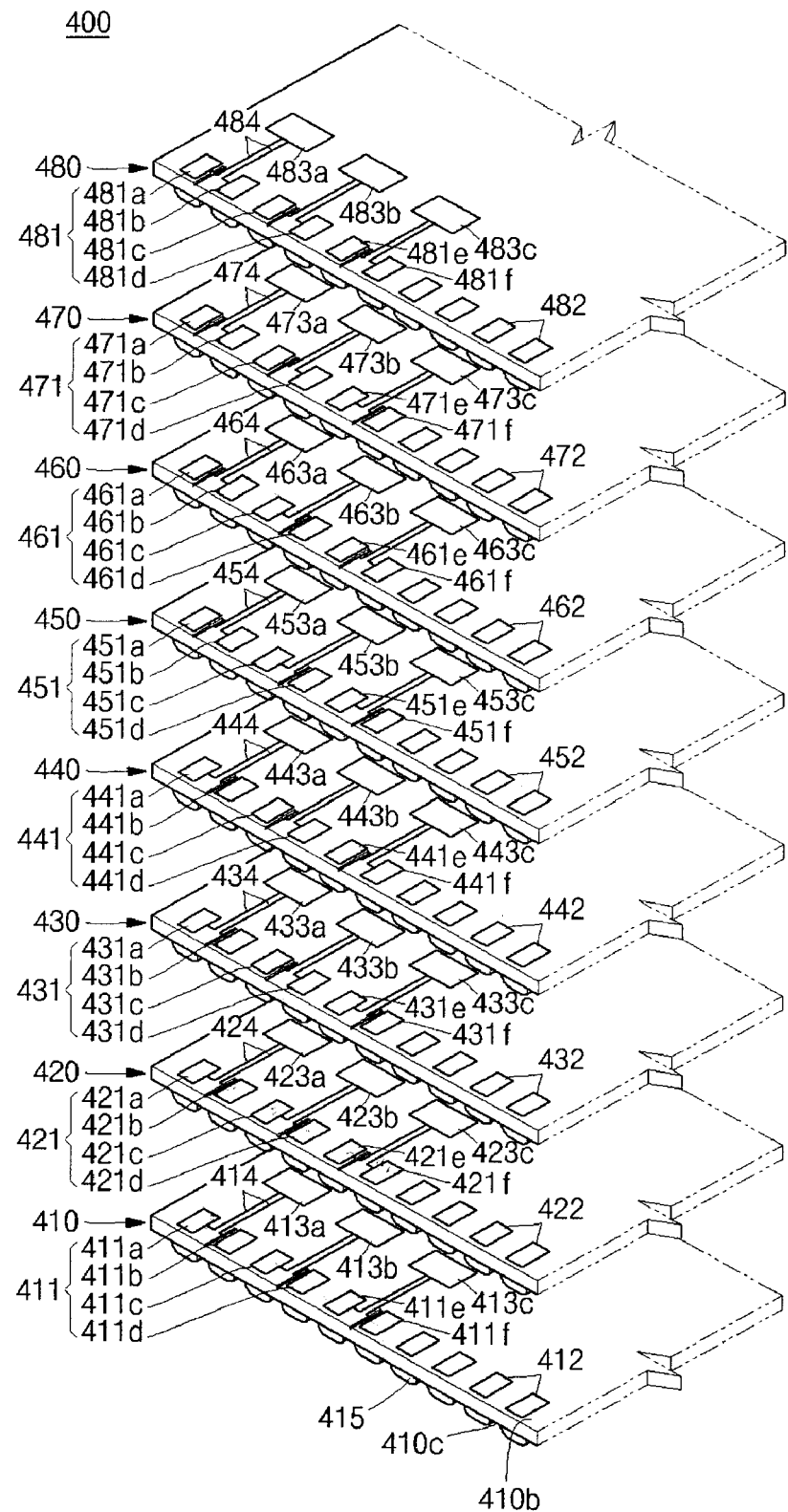
FIG. 4 is an exploded perspective view illustrating a semiconductor package according to another embodiment of the present invention.

Referring to FIG. 4, there is illustrated an exploded perspective view of a semiconductor package 400 according to another embodiment of the present invention.

As illustrated in FIG. 4, the semiconductor package 400 comprises a first semiconductor chip 410, a second semiconductor chip 420, a third semiconductor chip 430, a fourth semiconductor chip 440, a fifth semiconductor chip 450, a sixth semiconductor chip 460, a seventh semiconductor chip 470 and an eighth semiconductor chip 480. Through-silicon vias are formed in the semiconductor chips 410, 420, 430, 440, 450, 460, 470 and 480. The through-silicon vias of the semiconductor chips 410, 420, 430, 440, 450, 460, 470 and 480 have the same structure and are arranged in the same configuration. The through-silicon vias of each semiconductor chip include at least one chip enable pad and at least one signal pad.

The semiconductor package 400 is a stack of the eight semiconductor chips and is structurally similar to the semiconductor package 200 illustrated in FIG. 2. As the number of the stacked semiconductor chips in the semiconductor package 400 increases to eight, the number of chip enable pads through which selection signals are applied and chip enable pins increases compared to the semiconductor package 200. The chip enable pads and the chip enable pins, which are elements distinguishing the semiconductor package 400 from the semiconductor package 200, and conductive lines connecting the chip enable pads to the chip enable pins will be mainly explained below.

The first semiconductor chip 410 includes chip enable pads 411 by which the first semiconductor chip 410 is selected, signal pads 412 through which common signals are delivered, chip enable pins 413a, 413b and 413c by which the selection of the semiconductor chip 410 is determined in response to signals applied through the chip enable pads 411, conductive lines 414 through which the chip enable pads 411 are electrically connected to the chip enable pins 413a, 413b and 413c, and first solder balls 415 electrically connected to the chip enable pads 411 and the signal pads 412 through the through-silicon vias of the first semiconductor chip 410.

The chip enable pads 411 are formed so as to penetrate a first flat plane 410b of the first semiconductor chip 410 and a second flat plane 410c opposite to the first plane 410b. The chip enable pads 411 include a first chip enable pad 411a, a second chip enable pad 411b, a third chip enable pad 411c, a fourth chip enable pad 411d, a fifth chip enable pad 411e and a sixth chip enable pad 411f. The chip enable pins 413a, 413b and 413c include a first chip enable pin 413a, a second chip enable pin 413b and a third chip enable pin 413c. The chip enable pads 411 may be electrically connected to or disconnected from the chip enable pins 413a, 413b and 413c through the conductive lines 414.

The first chip enable pad 411a is electrically connected to the first chip enable pin 413a, the third chip enable pad 411c is electrically connected to the second chip enable pin 413b, and the fifth chip enable pad 411e is electrically connected to the third chip enable pin 413c through the respective conductive lines 414. The conductive lines 414 connecting the second chip enable pad 411b to the first chip enable pin 413a, the fourth chip enable pad 411d to the second chip enable pin 413b and the sixth chip enable pad 411f to the third chip enable pin 413c are sawn such that the second, fourth and sixth chip enable pads 411b, 411d and 411f are electrically disconnected from the chip enable pins 413a, 413b and 413c, respectively.

That is, the first, third and fifth chip enable pads 411a, 411c and 411e are electrically connected to the chip enable pins 413a, 413b and 413c, respectively, through the conductive lines 414, and the second, fourth and sixth chip enable pads 411b, 411d and 411f are electrically disconnected to the chip enable pins 413a, 413b and 413c, respectively, through cuts in the conductive lines 414.

Due to this electrical connection/disconnection, the first semiconductor chip 410 receives the selection signals applied through the first, third and fifth chip enable pads 411a, 411c and 411e, and is then selected.

The chip enable pins 413a, 413b and 413c may be electrically connected to or disconnected from the chip enable pads 411 through the conductive lines 414 and determines whether or not to select the first semiconductor chip 410 through the chip enable pads 411 through which selection signals are applied. The first chip enable pin 413a is electrically connected to the first chip enable pad 411a, the second chip enable pin 413b is electrically connected to the third chip enable pad 411c and the third chip enable pin 413c is electrically connected to the fifth chip enable pad 411e through the respective conductive lines 414. The first chip enable pin 413a is electrically disconnected from the second chip enable pad 411b, the second chip enable pin 413b is electrically disconnected from the fourth chip enable pad 411d and the third chip enable pin 413c is electrically disconnected from the sixth chip enable pad 411f through cuts in the respective conductive lines 414. The chip enable pins 413a, 413b and 413c can be formed on the first plane 410b of the first semiconductor chip 410.

The conductive lines 414 electrically connect or disconnect the chip enable pads 411 to or from the chip enable pins 413a, 413b and 413c. The conductive lines 414 are formed on the first plane 410b of the first semiconductor chip 410. The first plane 410b can be sawn to electrically disconnect the chip enable pads 411 from the chip enable pins 413a, 413b and 413c. Specifically, the conductive lines 414 connected to the second, fourth and sixth chip enable pads 411b, 411d and 411f are sawn to form cuts in the conductive lines 414 to electrically disconnect the second, fourth and sixth chip enable pads 411b, 411d and 411f from the chip enable pins 413a, 413b and 413c. There is no restriction on the sawing method of the conductive lines 414. For example, a laser may be used to saw the conductive lines 414.

The second to eighth semiconductor chips 420, 430, 440, 450, 460, 470 and 480 are distinguished from the first semiconductor chip 410 by electrical connections between their constituent chip enable pads and chip enable pins. In other words, the second to eighth semiconductor chips 420, 430, 440, 450, 460, 470 and 480 have the same structure as the first semiconductor chip 410 except for the connection between the chip enable pads and chip enable pins after sawing of their constituent conductive lines.

In the second semiconductor chip 420, a first chip enable pad 421a is electrically connected to a first chip enable pin 423a through a corresponding conductive line 424, a third chip enable pad 421c is electrically connected to a second chip enable pin 423b through a corresponding conductive line 424, a sixth chip enable pad 421f is electrically connected to a third chip enable pin 423c through a corresponding conductive line 424, a second chip enable pad 421b is electrically disconnected from the first chip enable pin 423a through a cut in a corresponding conductive line 424, a fourth chip enable pad 421d is electrically disconnected from the second chip enable pin 423b through a cut in a corresponding conductive line 424, and a fifth chip enable pad 421e is electrically disconnected from the third chip enable pin 423c through a cut in a corresponding conductive line 424. Due to this electrical connection/disconnection, the second semiconductor chip 420 receives the selection signals applied through the first, third and sixth chip enable pads 421a, 421c and 421f, and is then selected.

In the third semiconductor chip 430, a first chip enable pad 431a is electrically connected to a first chip enable pin 433a through a corresponding conductive line 434, a fourth chip enable pad 431d is electrically connected to a second chip enable pin 433b through a corresponding conductive line 434, a fifth chip enable pad 431e is electrically connected to a third chip enable pin 433c through a corresponding conductive line 434, a second chip enable pad 431b is electrically disconnected from the first chip enable pin 433a through a cut in a corresponding conductive line 434, a third chip enable pad 431c is electrically disconnected from the second chip enable pin 433b through a cut in a corresponding conductive line 434, and a sixth chip enable pad 431f is electrically disconnected from the third chip enable pin 433c through a cut in a corresponding conductive line 434. Due to this electrical connection/disconnection, the third semiconductor chip 430 receives the selection signals applied through the first, fourth and fifth chip enable pads 431a, 431d and 431e, and is then selected.

In the fourth semiconductor chip 440, a first chip enable pad 441a is electrically connected to a first chip enable pin 443a through a corresponding conductive line 444, a fourth chip enable pad 441d is electrically connected to a second chip enable pin 443b through a corresponding conductive line 444, a sixth chip enable pad 441f is electrically connected to a third chip enable pin 443c through a corresponding conductive line 444, a second chip enable pad 441b is electrically disconnected from the first chip enable pin 443a through a cut in a corresponding conductive line 444, a third chip enable pad 441c is electrically disconnected from the second chip enable pin 443b through a cut in a corresponding conductive line 444, and a fifth chip enable pad 441e is electrically disconnected from the third chip enable pin 443c through a cut in a corresponding conductive line 444. Due to this electrical connection/disconnection, the fourth semiconductor chip 440 receives the selection signals applied through the first, fourth and sixth chip enable pads 441a, 441d and 441f, and is then selected.

In the fifth semiconductor chip 450, a second chip enable pad 451b is electrically connected to a first chip enable pin 453a through a corresponding conductive line 454, a third chip enable pad 451c is electrically connected to a second chip enable pin 453b through a corresponding conductive line 454, a fifth chip enable pad 451e is electrically connected to a third chip enable pin 453c through a corresponding conductive line 454, a first chip enable pad 451a is electrically disconnected from the first chip enable pin 453a through a cut in a corresponding conductive line 454, a fourth chip enable pad 451d is electrically disconnected from the second chip enable pin 453b through a cut in a corresponding conductive line 454, and a sixth chip enable pad 451f is electrically disconnected from the third chip enable pin 453c through a cut in a corresponding conductive line 454. Due to this electrical connection/disconnection, the fifth semiconductor chip 450 receives the selection signals applied through the second, third and fifth chip enable pads 451b, 451c and 451e, and is then selected.

In the sixth semiconductor chip 460, a second chip enable pad 461b is electrically connected to a first chip enable pin 463a through a corresponding conductive line 464, a third chip enable pad 461c is electrically connected to a second chip enable pin 463b through a corresponding conductive line 464, a sixth chip enable pad 461f is electrically connected to a third chip enable pin 463c through a corresponding conductive line 464, a first chip enable pad 461a is electrically disconnected from the first chip enable pin 463a through a cut in a corresponding conductive line 464, a fourth chip enable pad 461d is electrically disconnected from the second chip enable pin 463b through a cut in a corresponding conductive line 464, and a fifth chip enable pad 461e is electrically disconnected from the third chip enable pin 463c through a cut in a corresponding conductive line 464. Due to this electrical connection/disconnection, the sixth semiconductor chip 460 receives the selection signals applied through the second, third and sixth chip enable pads 461b, 461c and 461f, and is then selected.

In the seventh semiconductor chip 470, a second chip enable pad 471b is electrically connected to a first chip enable pin 473a through a corresponding conductive line 474, a fourth chip enable pad 471d is electrically connected to a second chip enable pin 473b through a corresponding conductive line 474, a fifth chip enable pad 471e is electrically connected to a third chip enable pin 473c through a corresponding conductive line 474, a first chip enable pad 471a is electrically disconnected from the first chip enable pin 473a through a cut in a corresponding conductive line 474, a third chip enable pad 471c is electrically disconnected from the second chip enable pin 473b through a cut in a corresponding conductive line 474, and a sixth chip enable pad 471f is electrically disconnected from the third chip enable pin 473c through a cut in a corresponding conductive line 474. Due to this electrical connection/disconnection, the seventh semiconductor chip 470 receives the selection signals applied through the second, fourth and fifth chip enable pads 471b, 471d and 471e, and is then selected.

In the eighth semiconductor chip 480, a second chip enable pad 481b is electrically connected to a first chip enable pin 483a through a corresponding conductive line 484, a fourth chip enable pad 481d is electrically connected to a second chip enable pin 483b through a corresponding conductive line 484, a sixth chip enable pad 481f is electrically connected to a third chip enable pin 483c through a corresponding conductive line 484, a first chip enable pad 481a is electrically disconnected from the first chip enable pin 483a through a cut in a corresponding conductive line 484, a third chip enable pad 481c is electrically disconnected from the second chip enable pin 483b through a cut in a corresponding conductive line 484, and a fifth chip enable pad 481e is electrically disconnected from the third chip enable pin 483c through a cut in a corresponding conductive line 484. Due to this electrical connection/disconnection, the eighth semiconductor chip 480 receives the selection signals applied through the second, fourth and sixth chip enable pads 481b, 481d and 481f, and is then selected.

The first to eighth semiconductor chips 410, 420, 430, 440, 450, 460, 470 and 480 of the semiconductor package 400 are structurally identical and have the same pattern. Therefore, the semiconductor chips of the semiconductor package 400 can be produced using masks of the same design, resulting in a reduction in production cost and an improvement in productivity. In the semiconductor package 400, the conductive lines can be sawn to select the first to eight semiconductor chips. The semiconductor chips of the semiconductor package 400 can be configured to have the same design, thus eliminating the need for troublesome production management and control of the semiconductor chips. In addition, the semiconductor chips of the semiconductor package 400 can be produced by the same process without the need to separate the semiconductor chips prior to the sawing of the conductive lines.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor package comprising a first semiconductor chip, the first semiconductor chip comprising:
   a first chip enable pad;
   a second chip enable pad;
   a first chip enable pin;
   a first conductive line coupling the first chip enable pad to the first chip enable pin;
   a second conductive line coupled to the second chip enable pad and to the first chip enable pin; and
   a cut in the second conductive line electrically isolating the second chip enable pad from the first chip enable pin.

2. The semiconductor package of claim 1 wherein the first semiconductor chip further comprises:
   at least one signal pad.

3. The semiconductor package of claim 1 wherein the first semiconductor chip further comprises:
   a first plane;
   a second plane; and
   through-silicon vias extending between the first plane and the second plane.

4. The semiconductor package of claim 3 wherein the first chip enable pad, the second chip enable pad, and the first chip enable pin are on the first plane.

5. The semiconductor package of claim 4 wherein the through-silicon vias are coupled to the first chip enable pad and the second chip enable pad.

6. The semiconductor package of claim 5 wherein the first semiconductor chip further comprises:
   solder balls on the second plane, the solder balls coupled to the through-silicon vias.

7. The semiconductor package of claim 1 wherein the first semiconductor chip further comprises:
   a third chip enable pad;
   a fourth chip enable pad;
   conductive lines coupled to the third and fourth chip enable pads and to the first chip enable pin; and
   cuts in the conductive lines electrically isolating the third and fourth chip enable pads from the first chip enable pin.

8. The semiconductor package of claim 7 wherein the first semiconductor chip further comprises:
- a fifth chip enable pad;
- a sixth chip enable pad;
- a seventh chip enable pad;
- an eighth chip enable pad;
- a second chip enable pin;
- conductive lines coupled to the fifth, sixth, seventh, and eighth chip enable pads and to the second chip enable pin; and
- cuts in the conductive lines electrically isolating the fifth, sixth, seventh, and eighth chip enable pads from the second chip enable pin.

9. The semiconductor package of claim 1 wherein the first semiconductor chip further comprises:
- a third chip enable pad;
- a fourth chip enable pad;
- a second chip enable pin;
- conductive lines coupled to the third and fourth chip enable pads and to the second chip enable pin; and
- a cut in one of the conductive lines electrically isolating the fourth chip enable pad from the second chip enable pin.

10. The semiconductor package of claim 9 wherein the first semiconductor chip further comprises:
- a fifth chip enable pad;
- a sixth chip enable pad;
- a third chip enable pin;
- conductive lines coupled to the fifth and sixth chip enable pads and to the third chip enable pin; and
- a cut in one of the conductive lines electrically isolating the sixth chip enable pad from the third chip enable pin.

11. A semiconductor package comprising:
- a first semiconductor chip;
- a second semiconductor chip stacked on the first semiconductor chip;
- a third semiconductor chip stacked on the second semiconductor chip;
- a fourth semiconductor chip stacked on the third semiconductor chip, wherein each of the first, second, third, and fourth semiconductor chips comprises:
- a first chip enable pad;
- a second chip enable pad;
- a third chip enable pad;
- a fourth chip enable pad;
- a chip enable pin;
- conductive lines coupled to the first, second, third, and fourth chip enable pads and to the chip enable pin; and
- cuts in three of the conductive lines electrically isolating the respective chip enable pads from the chip enable pin.

12. The semiconductor package of claim 11, wherein the first chip enable pad of the first semiconductor chip is coupled to the chip enable pin of the first semiconductor chip by a respective conductive line.

13. The semiconductor package of claim 12, wherein the second, third, and fourth chip enable pads of the first semiconductor chip are electrically isolated from the chip enable pin of the first semiconductor chip by the cuts.

14. The semiconductor package of claim 12, wherein the second chip enable pad of the second semiconductor chip is coupled to the chip enable pin of the second semiconductor chip by a respective conductive line,
- wherein the third chip enable pad of the third semiconductor chip is coupled to the chip enable pin of the third semiconductor chip by a respective conductive line, and
- wherein the fourth chip enable pad of the fourth semiconductor chip is coupled to the chip enable pin of the fourth semiconductor chip by a respective conductive line.

15. The semiconductor package of claim 14, wherein the second, third, and fourth chip enable pads of the first semiconductor chip are electrically isolated from the chip enable pin of the first semiconductor chip by the cuts,
- wherein the first, third, and fourth chip enable pads of the second semiconductor chip are electrically isolated from the chip enable pin of the second semiconductor chip by the cuts,
- wherein the first, second, and fourth chip enable pads of the third semiconductor chip are electrically isolated from the chip enable pin of the third semiconductor chip by the cuts, and
- wherein the first, second, and third chip enable pads of the fourth semiconductor chip are electrically isolated from the chip enable pin of the fourth semiconductor chip by the cuts.

16. The semiconductor package of claim 11 wherein the first chip enable pads of the first, second, third, and fourth semiconductor chips are electrically interconnected,
- wherein the second chip enable pads of the first, second, third, and fourth semiconductor chips are electrically interconnected,
- wherein the third chip enable pads of the first, second, third, and fourth semiconductor chips are electrically interconnected, and
- wherein the fourth chip enable pads of the first, second, third, and fourth semiconductor chips are electrically interconnected.

17. The semiconductor package of claim 16 wherein each of the first, second, third, and fourth semiconductor chips further comprises:
- a first plane, wherein the first, second, third, and fourth chip enable pads are on the first plane;
- a second plane;
- solder balls on the second plane; and
- through-silicon vias extending between the first plane and the second plane and coupling the solder balls with the first, second, third, and fourth chip enable pads.

18. A semiconductor package comprising:
- a first semiconductor chip;
- a second semiconductor chip stacked on the first semiconductor chip;
- a third semiconductor chip stacked on the second semiconductor chip;
- a fourth semiconductor chip stacked on the third semiconductor chip, wherein the first semiconductor chip comprises:
- a first chip enable pad;
- a second chip enable pad;
- a third chip enable pad;
- a fourth chip enable pad;
- a chip enable pin;
- conductive lines coupled to the first, second, third, and fourth chip enable pads and to the chip enable pin; and
- cuts in three of the conductive lines electrically isolating the respective chip enable pads from the chip enable pin.

19. The semiconductor package of claim 18 further comprising:
- a fifth semiconductor chip stacked on the first semiconductor chip;
- a sixth semiconductor chip stacked on the fifth semiconductor chip;
- a seventh semiconductor chip stacked on the sixth semiconductor chip;
- an eighth semiconductor chip stacked on the seventh semiconductor chip.

20. The semiconductor package of claim 19 wherein each of the second, third, fourth, fifth, sixth, seventh, and eighth semiconductor chips comprises:
   a first chip enable pad;
   a second chip enable pad;
   a third chip enable pad;
   a fourth chip enable pad;
   a first chip enable pin;
   a fifth chip enable pad;
   a sixth chip enable pad;
   a seventh chip enable pad;
   an eighth chip enable pad;
   a second chip enable pin;
   eight conductive lines coupled to the first, second, third, fourth chip enable pads and to the first chip enable pin and coupled to the fifth, sixth, seventh, eighth chip enable pads and to the second chip enable pin; and
   cuts in seven of the conductive lines electrically isolating the respective chip enable pads from the respective chip enable pins.

* * * * *